United States Patent
Thomas

(10) Patent No.: US 9,299,868 B2
(45) Date of Patent: Mar. 29, 2016

(54) SOLAR PANEL MOUNTING AND INSTALLATION

(71) Applicant: Marc M. Thomas, Mokelumne Hill, CA (US)

(72) Inventor: Marc M. Thomas, Mokelumne Hill, CA (US)

(*) Notice: Subject to any disclaimer, the term of this patent is extended or adjusted under 35 U.S.C. 154(b) by 103 days.

(21) Appl. No.: 13/633,040

(22) Filed: Oct. 1, 2012

(65) Prior Publication Data

US 2014/0090693 A1 Apr. 3, 2014

(51) Int. Cl.
*H01L 31/042* (2014.01)
*H01L 31/18* (2006.01)
*F24J 2/46* (2006.01)
*F24J 2/52* (2006.01)

(52) U.S. Cl.
CPC .......... *H01L 31/0422* (2013.01); *F24J 2/4636* (2013.01); *F24J 2/5205* (2013.01); *F24J 2/5258* (2013.01); *F24J 2/5264* (2013.01); *H01L 31/18* (2013.01); *H02S 20/00* (2013.01); *F24J 2002/5298* (2013.01); *Y02E 10/50* (2013.01); *Y10T 29/49355* (2015.01); *Y10T 403/60* (2015.01)

(58) Field of Classification Search
CPC ....... F24J 2/5207; F24J 2/5245; F24J 2/5249; F24J 2/5205; F24J 2/5264; F24J 2/5258; F24J 2/4636; H01L 31/0422
USPC .......... 52/173.2; 136/251; 248/274.14, 309.1
See application file for complete search history.

(56) References Cited

U.S. PATENT DOCUMENTS

| | | | |
|---|---|---|---|
| 4,319,844 A | * | 3/1982 | Auger .................. F24J 2/10 356/399 |
| 4,358,183 A | | 11/1982 | Whiteford |
| 5,762,720 A | | 6/1998 | Hanoka et al. |

(Continued)

FOREIGN PATENT DOCUMENTS

| | | | | |
|---|---|---|---|---|
| DE | 10233973 A1 | * | 2/2004 | ............. E04D 3/366 |
| DE | 102009018362 | * | 11/2010 | ............ F16B 37/046 |

(Continued)

OTHER PUBLICATIONS

Sharp Electronics Corporation (Solar Energy Solutions Group); Solar Power System Installation Manual,; SRS Mounting System, Rectangular Modules; 44 pages.

(Continued)

*Primary Examiner* — Brian Glessner
*Assistant Examiner* — Adam Barlow
(74) *Attorney, Agent, or Firm* — Kolisch Hartwell, P.C.

(57) ABSTRACT

A solar panel mounting system may include a solar panel mounting assembly for mounting to a support structure. The solar panel mounting assembly may include a restraining element, a retaining element and a biasing assembly that supports the restraining and retaining elements. The support structure may include an upper surface and a lower surface spaced from the upper surface. The biasing assembly may further include a biasing element that resiliently urges the retaining element toward a securing element for supporting a solar panel that is positioned between the retaining element and the upper surface of the support structure, and resiliently urges the restraining element toward the lower surface of the support structure. A retention device may resiliently bias the solar panels of a solar panel assembly together on a support structure.

3 Claims, 5 Drawing Sheets

(56) References Cited

U.S. PATENT DOCUMENTS

| | | |
|---|---|---|
| 6,465,724 B1 | 10/2002 | Garvison et al. |
| 6,672,018 B2 | 1/2004 | Shingleton |
| 2008/0053517 A1 | 3/2008 | Plaisted et al. |
| 2008/0095591 A1* | 4/2008 | Wu .................... F16B 37/046 411/161 |
| 2008/0169018 A1 | 7/2008 | Miyamoto et al. |
| 2009/0114271 A1 | 5/2009 | Stancel |
| 2009/0230265 A1 | 9/2009 | Newman et al. |
| 2010/0018571 A1 | 1/2010 | Placer |
| 2010/0065108 A1 | 3/2010 | West et al. |
| 2010/0219309 A1 | 9/2010 | Hermann et al. |
| 2010/0236610 A1 | 9/2010 | Stancel et al. |
| 2010/0252092 A1 | 10/2010 | Lenox |
| 2010/0294340 A1 | 11/2010 | Cunningham et al. |
| 2011/0000525 A1 | 1/2011 | Wu et al. |
| 2011/0100434 A1* | 5/2011 | Van Walraven ........ F24J 2/5205 136/251 |
| 2011/0203637 A1 | 8/2011 | Patton et al. |
| 2011/0209745 A1 | 9/2011 | Korman et al. |
| 2011/0214365 A1 | 9/2011 | Aftanas |
| 2011/0277296 A1 | 11/2011 | Ramos |
| 2011/0290307 A1 | 12/2011 | Workman et al. |

FOREIGN PATENT DOCUMENTS

| | | | |
|---|---|---|---|
| EP | 2239783 | 10/2010 | |
| NL | WO 03098126 A1 * | 11/2003 | ............. F24J 2/5205 |
| WO | WO 03098126 A1 * | 11/2003 | |

OTHER PUBLICATIONS

World Intellectual Property Organization (Blaine R. Copenheaver, authorized officer); International Search Report and Written Opinion for PCT/US2013/061895; mailing date Feb. 18, 2014; 9 pages.

* cited by examiner

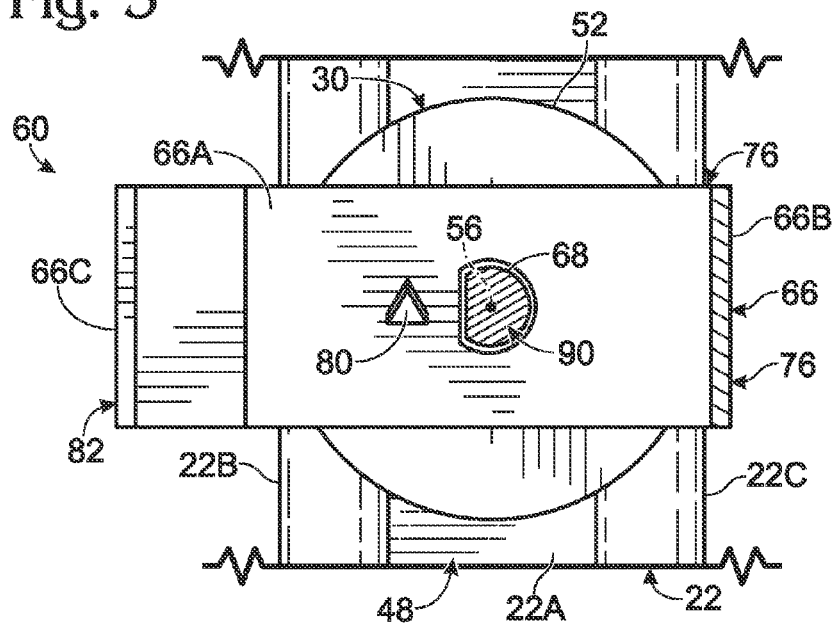
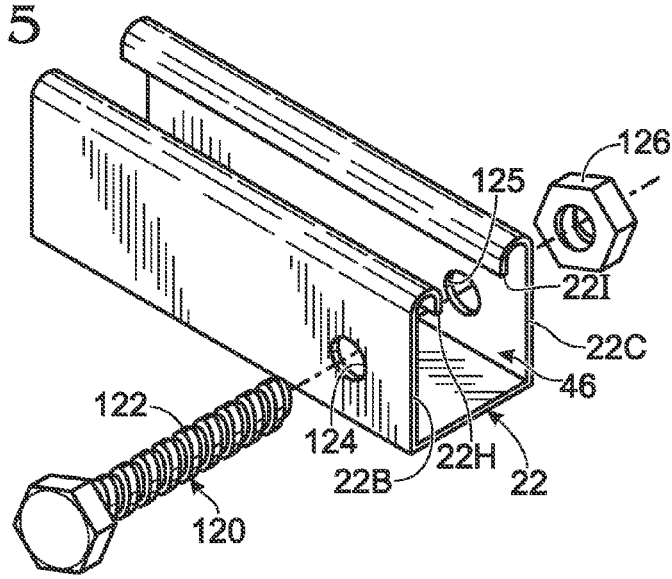
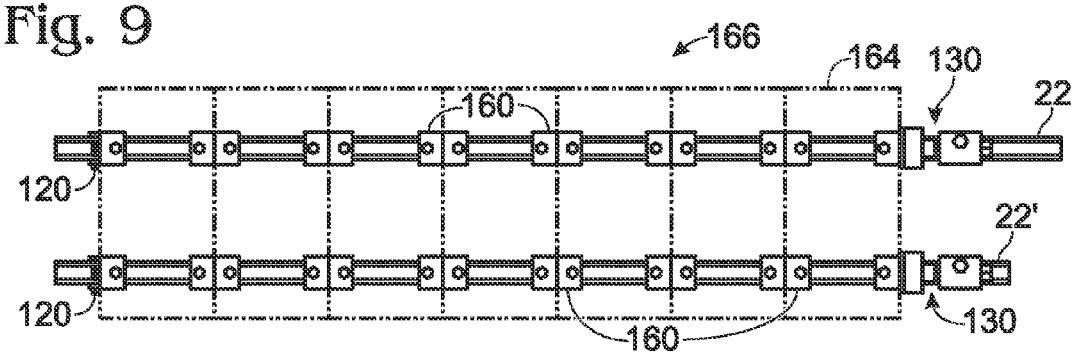

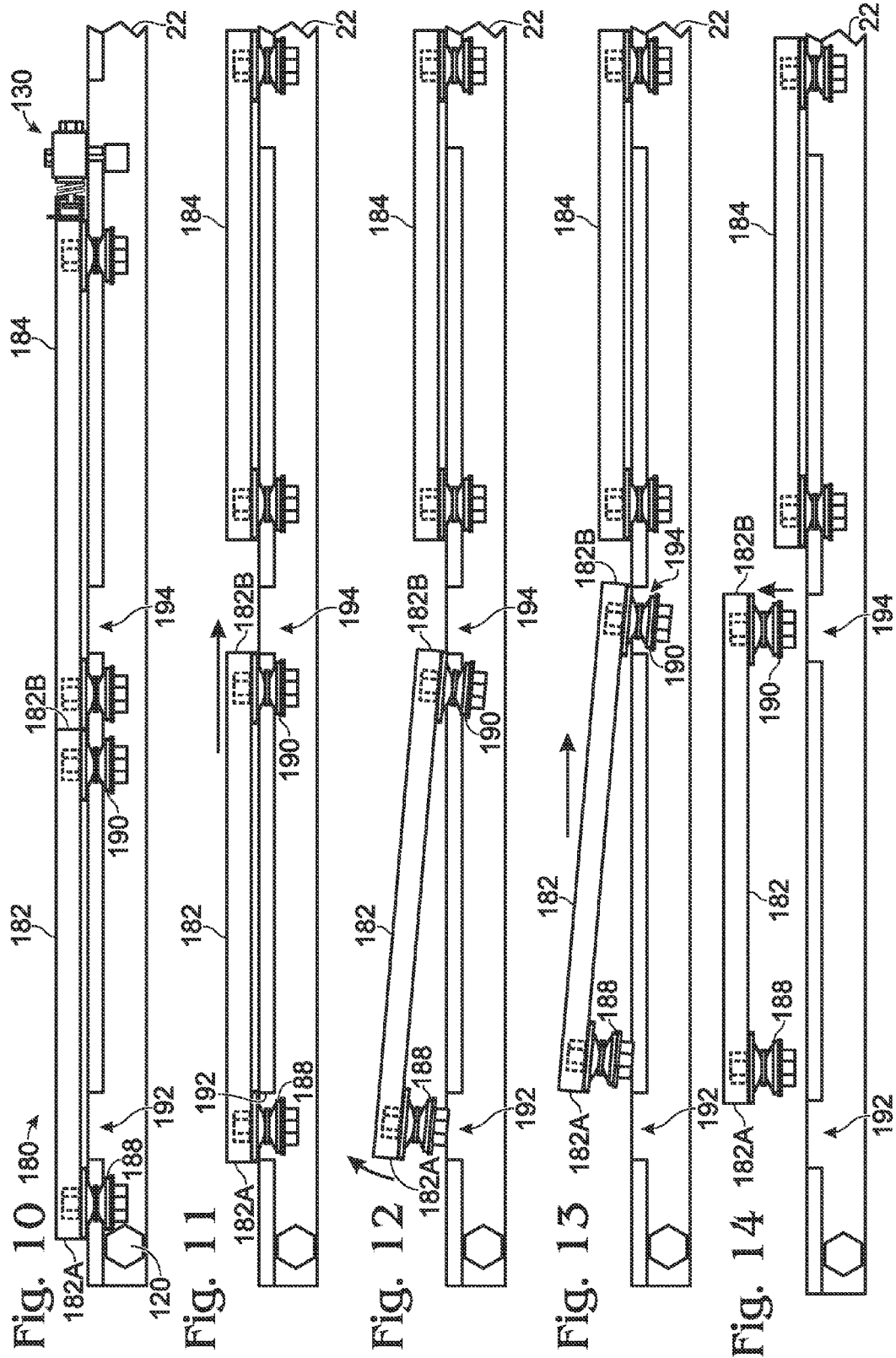

SOLAR PANEL MOUNTING AND INSTALLATION

TECHNICAL FIELD

The present inventions relate generally to the field of solar panels and mounting systems. More specifically, the present inventions relate to systems and methods for installing solar panels and for mounting solar panels.

BACKGROUND OF THE DISCLOSURE

Solar panels are mounted in a fixed position to racks or frames and often these rack-and-frame mounting systems require a substantial amount of preparation time and resources on-site before the solar panels may actually be installed. Each solar panel is attached at spaced positions to racks or structures that are secured to a foundation or structure. Each point of attachment is secured to the mounting point of a framed or unframed solar panel using mounting elements that fit in a track and are firmly secured by rotation or other means relative to the mounting frame. Several installers may be required to pick up, move and position the solar panel and mount the mounting elements and secure the solar panels to the rack. Positioning of large solar panels often involves awkward installer positioning or mechanized assistance. Each panel is mounted in its final position on the mounting frame or rack, and each panel is installed in a different position to maximize solar exposure to each panel. Framed and unframed solar panels and their mounting assemblies may be subject to stresses during installation and when installed int heir fixed positions from natural elements and changes in ambient conditions over time.

BRIEF SUMMARY OF THE DISCLOSURE

An example of a solar panel mounting system may include a solar panel mounting assembly for mounting to a support structure. The solar panel mounting assembly may include a restraining element, a retaining element and a biasing assembly that supports the restraining and retaining elements. The support structure may have an upper surface and a lower surface spaced from the upper surface. The biasing assembly may be mounted on the support structure with the restraining element below the lower surface of the support structure and the retaining element above the upper surface of the support structure. The biasing assembly may further include a biasing element that resiliently urges the retaining element toward a securing element for supporting a solar panel that is positioned between the retaining element and the upper surface of the support structure, and resiliently urges the restraining element toward the lower surface of the support structure.

In another example, a solar panel assembly may include a solar panel, a support structure and at least one mounting assembly. The support structure may include a support rail having an elongate slot and two inwardly bent flanges extending into the elongate slot. The mounting assembly may have a rod member, a biasing element and a sliding assembly. The sliding assembly may include at least one conical washer in operative contact with a surface of the two inwardly bent flanges.

In yet another example, a solar panel mounting system may include a solar panel assembly and a retention device. The retention device may include a base assembly, a stop member and a bias member. The base assembly may include a base member and a base arm supported on the base member and supporting the stop member. The stop member may be movable relative to the base assembly on an axis. The bias member may urge the stop member along the axis away from the base member when the retention device is mounted with the stop member in operative contact with the solar panel.

An example of a method of mounting a solar panel to a support may include mounting each of a first plurality of mounting assemblies to a first solar panel; mounting the first plurality of mounting assemblies onto one or more elongate support rails; and sliding the first plurality of mounting assemblies along a length of the one or more support rails while the first solar panel is mounted on the first plurality of mounting assemblies.

BRIEF DESCRIPTION OF THE DRAWINGS

FIG. 3 is a cross-sectional view of the solar-panel mounting assembly taken along line 3-3 of FIG. 2.

FIG. 5 is an exploded view showing a support structure and a stop member.

FIG. 9 is a simplified top view of an array of solar panels mounted on a support structure with mounting assemblies and retention devices.

FIG. 10 is a simplified cross-section of an example of showing two solar panels mounted on a support structure.

FIG. 11 is a diagram similar to FIG. 10. showing movement of the solar panels in preparation for removal of one end of a solar panel.

FIG. 12 is a diagram similar to FIG. 11. showing the one end of the solar panel removed from the support structure.

FIG. 13 is a diagram similar to FIG. 12. showing movement of the solar panel to a position in preparation for removal of a second end of the solar panel from the support structure.

FIG. 14 is a diagram similar to FIG. 13 showing the solar panel completely removed from the support structure.

DETAILED DESCRIPTION OF VARIOUS EMBODIMENTS

Figure 1:
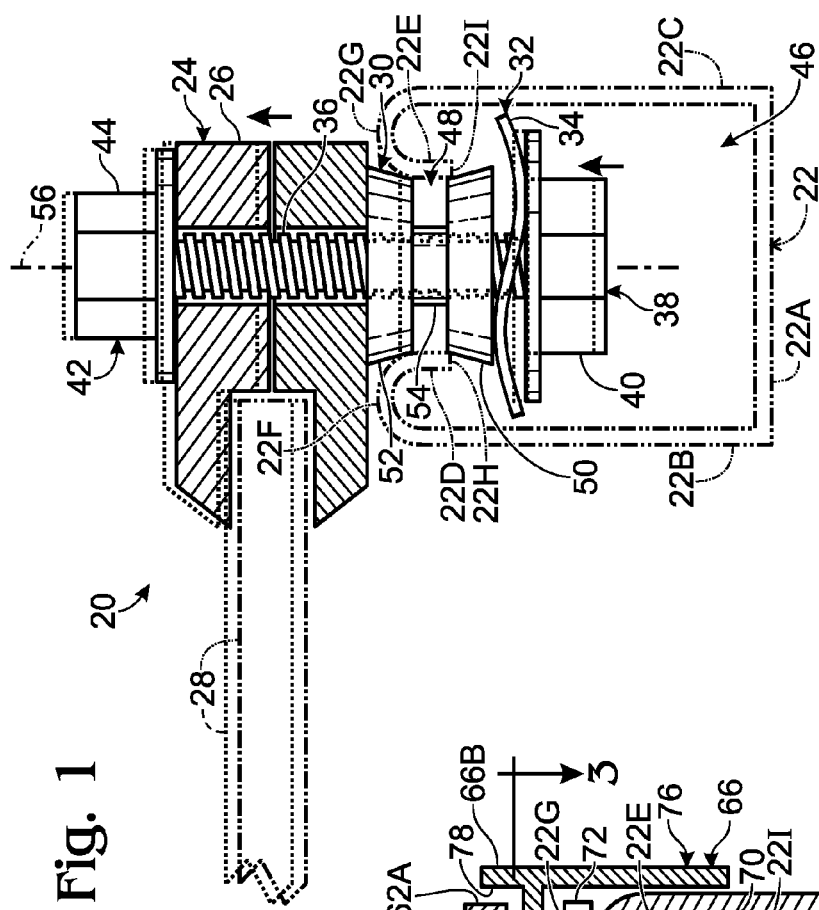
FIG. 1 is a partial cross-sectional view of an example of a solar panel mounting assembly configured for supporting the vertical position of a frameless solar panel.

A first example of a mounting assembly 20 for supporting a solar panel relative to a support structure 22, shown in phantom lines, is shown in a side cross section generally in FIG. 1. In this example, the mounting assembly 20 includes a securing element 24 for supporting a solar panel in the form of a frameless solar panel bracket 26 for supporting a frameless solar panel 28. The mounting assembly may further include a guide assembly 30 and a biasing element 32 in the form of a spring washer 34. The mounting assembly 20 further includes a rod member 36, a restraining member 38 in the form of a lower tightening member 40 and a retaining member 42 in the form of an upper tightening member 44. In one example, threaded rod member 36 and lower tightening member 40 may comprise the threaded shaft and head of a bolt, and upper tightening member 44 may be a nut that is threadedly received on the bolt shaft.

The support structure 22 may have different configurations. In this example, the support structure has a bottom 22A that is mounted to an external foundation, not shown, and sides 22B and 22C forming a channel 46. This support structure 22 thus is in the form of an elongate rail having an upwardly open U shape in cross section as shown. The top of the sides of the support structure 22 extend inwardly as opposing flanges 22D and 22E defining a narrowed elongate slot 48. In this example, the two inwardly bent flanges 22D and 22E have respective upper surfaces 22F and 22G and lower surfaces 22H and 22I spaced from the upper surfaces.

The guide assembly 30, in this example, may include a lower guide element 50, an upper guide element 52, and center element 54 disposed between the two guide elements. Elements 50, 52, and 54 are all ring shaped like washers having central openings through which rod member 36 passes. Guide elements 50 and 52 may be generally frusto-conically, rounded, or beveled shaped, or otherwise taper from a larger diameter portion disposed outside of slot 48 to a smaller diameter portion disposed in slot 48 adjacent to center element 54 disposed entirely in the slot. The larger diameter portions are wider than the slot and the smaller diameter portions are narrower than the slot so that the tapered region of guide element 50 contacts lower surfaces 22H and 22I of flanges 22D and 22E of the support structure and the tapered region of guide element 52 contacts upper surfaces 22F and 22G of the flanges.

During use, the guide assembly 30 may function to center the mounting assembly 20 in the slot 48, as well as reduce friction by rotating around an axis 56 defined by the rod member 36 when mounting assembly 20 is positioned on and moved along support structure 22 as described further below. Once in position on the support structure, spring washer 34 biases guide element 50 against the lower surface of the two inwardly bent flanges 22D and 22E. Correspondingly, spring washer 34, acting through tightening element 40, rod member 36, tightening element 44, and solar panel bracket 26, may bias guide element 52 against the upper surfaces 22F and 22G of the two inwardly bent flanges.

The center element 54 may be positioned between the lower guide element 50 and the upper guide element 52. The center element 54 may be a bushing, washer or other type of bearing and may function to separate the lower guide element 50 from the upper guide element 52 to maintain a minimum separation between the guide elements, thereby facilitating insertion of the mounting assembly onto the support structure 22. For certain shapes of guide elements 50 and 52, the center element 54 may not be included. Additionally, as the mounting assembly 20 is slid along slot 48 of the support structure 22 with the guide elements 50 and 52 in contact with the upper surfaces 22F and 22 G and lower surfaces 22H and 22I of the flanges, the center element 54 may reduce friction between the guide elements and the support structure surfaces by rotating with one or both of the guide elements around the axis 56.

In this example, the biasing element 32 is positioned between the lower guide element 50 and the lower tightening member 40. The biasing element 32 may be one or more spring washers 34, as shown, but may also be one or more springs, spring fingers or other resilient element. As mentioned, the biasing element 32 may resiliently urge the lower guide element 50 away from the lower tightening member 40 and toward the lower surfaces 22H and 22I of the support structure 22.

Conversely, the biasing element 32 may resiliently urge the lower tightening member 40 away from the guide element 50. This force, acting through the rod member 36 and the upper tightening member 44, biases the frameless solar panel bracket 26 downwardly against the upper guide element 52 as well. An upward force, such as by manual manipulation of solar panel bracket 26, compresses biasing element 32 allowing the tightening members, rod member, and solar panel bracket to move upwardly slightly as shown by the dashed lines in FIG. 1. This reduces the pressure of guide element 52 on the upper surfaces of the support structure, facilitating movement of the bracket assembly normal to the plane of FIG. 1 along slot 48. Thus, the resilience provided by biasing element 32 allows vertical flexibility that allows absorption of physical stresses and accommodates tolerance variations during manufacture of the parts, while providing a sufficient amount of resilience to support the mounted solar panel on the support structure.

Figure 2:
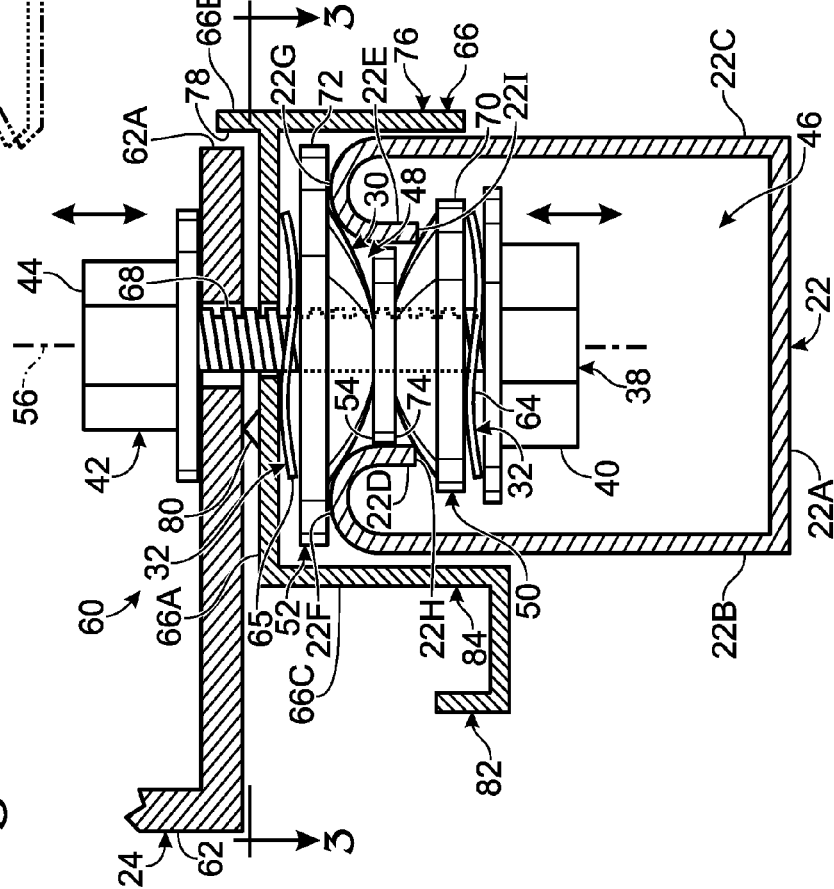
FIG. 2 is a partial cross-sectional view of a further example of a solar panel mounting assembly configured for a framed solar panel.

In another example, a mounting assembly for supporting a solar panel relative to a support structure 22 is shown generally at 60 in a side cross section in FIG. 2. In this example, the mounting assembly 60 is shown mounting a securing element 24 for supporting a solar panel in the form of a framed solar panel bracket 62 to a support structure 22. The mounting assembly may include a guide assembly 30, one or more biasing elements 32 in the form of one or more spring washers 64, and an anti-rotation element 66.

Similar to the example shown in FIG. 1, the mounting assembly 60 further includes a rod member 68, a restraining member 38 in the form of a lower tightening member 40 and a retaining member 42 in the form of an upper tightening member 44. Unlike the example shown in FIG. 1, the rod member 68 may be D-shaped as to provide an anti-rotation function in conjunction with the anti-rotation element 66, also shown in FIG. 3. Similar to the guide assembly shown in FIG. 1, in this example, the guide assembly 30 may include a lower guide element 50 in the form of a rounded washer 70, an upper guide element 52 in the form of a rounded washer 72, and center element 54 in the form of a flat washer 74 disposed between the two guide elements.

In the same way described above, elements 50, 52, and 54 are all ring shaped like washers having central openings through which rod member 68 passes. The rounded washers 70 and 72 may be generally rounded and taper from a larger diameter portion disposed outside of slot 48 to a smaller diameter portion disposed in slot 48 adjacent to flat washer 74 disposed entirely in slot 48. The larger diameter portions are wider than slot 48 and the smaller diameter portions are narrower than slot 48 so that the tapered region of rounded washer 70 contacts lower surfaces 22H and 22I of flanges 22D and 22E of the support structure 22, and the tapered region of rounded washer 72 contacts upper surfaces 22F and 22G of the flanges. Flat washer 74 may have a diameter equal to or less than the width of slot 48.

In this example, the guide assembly 30 may function similar to the guide assembly described above, as to center the mounting assembly 60 in slot 48 and reduce friction by rotating around an axis 56 defined by the rod member 68 when mounting assembly 60 is positioned on and moved along support structure 22. Once the guide assembly 30 is in the desired position on the support structure 22, one or more biasing elements 32 may bias the lower guide element 50 against the lower surfaces 22H and 22I, as well as bias the upper guide element 52 against the upper surfaces 22F and 22G.

In this example, one or more biasing elements 32 may include a lower spring washer 64 and an upper spring washer 65, as shown. The lower spring washer 64 may be positioned between the lower guide element 50 and the lower tightening member 40. The upper spring washer 65 may be positioned between the upper guide element 52 and the anti-rotation element 66. The lower spring washer 64 may resiliently urge the lower guide element 50 toward the lower surfaces 22H and 22I of the two inwardly bend flanges 22D and 22E and may resiliently urge the lower tightening member 40 away from the lower guide element 50. Since the lower tightening member 40 may be affixed to the rod member 68 and the upper tightening member 44, the lower spring washer 64 may bias downwardly the rod member 68, the upper tightening member 44, the framed solar panel bracket 62, the anti-rotation element 66, the upper spring washer 65, and the upper guide element 52.

In a similar but opposite effect, the upper spring washer 65 may resiliently urge the upper guide element 52 toward the upper surfaces 22F and 22G of the support structure 22 and may resiliently urge the anti-rotation element 66, the framed solar panel bracket 62, and upper tightening member 44 away from the upper guide element 52. Since the upper tightening member 44 may be affixed to the rod member 68 and the lower tightening member 40, the upper spring washer 65 may bias upwardly the rod member 68, the lower tightening member 40, the lower spring washer 64, and the lower guide element 50. Thus, the resilience provided by spring washers 64 and 65 allow for vertical flexibility that allows absorption of physical stresses and accommodates tolerance variations during manufacture of the parts, while providing a sufficient amount of resilience to support the mounted solar panel on the support structure. The use of two biasing elements increases the range of resilient movement of the parts, accommodating a wider range of stresses and tolerance variations.

This example of the mounting assembly may further include an anti-rotation element 66, which may be supported between the restraining element 38 and retaining element 42. An anti-rotation element 66 may have different configurations, but in this example the anti-rotation element 66 may be positioned between the framed solar panel bracket 62 and the upper spring washer 65. The anti-rotation element 66 may include a base plate portion 66A having an aperture through which rod member 68 passes.

A side plate 66B extending from a peripheral edge of the base plate portion extends downwardly proximate to side 22C of the support structure, forming a first contact portion 76. Side plate 66B also extends upwardly from plate portion 66A proximate to an edge 62A of solar panel bracket 62, forming a second contact portion 78 for contacting the framed solar panel bracket 62. During use, the first contact portion 76 may prevent rotation relative to the support structure 22, while the second contact portion 78 may prevent rotation relative to the framed solar panel bracket 62.

The anti-rotation element 66 may further include a ground contact element 80 and a ground mounting element 82. The ground contact element 80 may be a protrusion extending upwardly from the upper surface of base plate 66A of the anti-rotation element 66. The ground contact element 80 may make operative contact with the framed solar panel bracket 62 in order to create a ground connection between the solar panel frame and the anti-rotation element.

The anti-rotation element may include a J-shaped lug 66C extending downwardly alongside 22B of the support structure from base plate 66A opposite side plate 66B. The J-shaped lug may provide a ground mounting element 82 for connecting circuit grounds to the solar panel frame through the anti-rotation element. The ground mounting element 82 may further provide a third contact portion 84 extending along support-structure side 22B for contacting the support structure 22 when the anti-rotation element is rotated about axis 56. The third contact portion 84 may further assist in preventing rotation of the anti-rotation element 66 relative to the support structure 22. For certain applications of the anti-rotation element 66, the ground contact element 80 and ground mounting element 82 may not be included.

FIG. 3 shows a cross section of mounting assembly 60 taken along lines 3-3 of FIG. 2. In this view, the top of anti-rotation member 66 is seen over upper guide element 52 disposed on support structure 22. The anti-rotation element 66 is seen to include a D-shaped opening 90 through which D-shaped rod member 68 extends. As a result, rod member 68 and anti-rotation element 66 may be unable to rotate relative to each other. As previously described in FIG. 2, the side plate 66B of the anti-rotation element 66 may extend down along side 22C of the support structure 22 to provide first contact portion 76 for contacting the support structure 22.

In certain applications, such as this example, that include a ground mounting element 82, the J-shaped lug 66C of the anti-rotation element 66 may extend down along side 22B of the support structure 22, to provide a third contact portion 84 for contacting the support structure 22. Accordingly, the anti-rotation element 66 may be prevented from rotating relative to the support structure 22 and the D-shaped rod member 68 may be prevented from rotating relative to the anti-rotation element 68. Therefore, the D-shaped rod member 68 may be prevented from rotating relative to the support structure 22 and furthermore preventing the tightening members, shown in FIG. 2 and which are affixed to the D-shaped rod member 68, from rotating loose as elements in the guide assembly 30 rotate around axis 56 defined by the D-shaped rod member 68 during movement of the mounting assembly 60 along slot 48 of the support structure 22. It will be appreciated that anti-rotation member 66 would prevent rotation of solar panel securing element 24 relative to support structure 22. This function may be provided when the anti-rotation member has a circular opening in which rod member 68 is free to rotate.

As previously described, mounting assemblies 20 and 60 for supporting a solar panel relative to a support structure 22 shown in FIG. 1 and FIG. 2 may be incorporated in a solar panel assembly. For example, a solar panel assembly 100 is shown generally in FIG. 4. In this example, the solar panel assembly 100 may include a solar panel 28, a solar panel frame 62, and one or more mounting assemblies 102 for supporting solar panel 28 relative to one or more support structures 22. The support structures may be affixed to a foundation or base 104 by a suitable fastening device, such as fastening screws 105.

In this example, mounting assemblies 102 may each include a guide assembly 30, a biasing element 32, such as a compression spring 106, and an anti-rotation element 107. Anti-rotation element 107 is preferably constructed with one or more features as described above with regard to anti-rotation member 66. Each mounting assembly 102 may further include a rod member 36, a retaining member 42 in the form of upper tightening member 44, and a restraining member 38. In this example restraining member 38 is in the form of a lower grooved tightening member 108.

The guide assembly 30 may include a lower guide element 50 in the form of lower tightening member 108, an upper guide element 52 in the form of a tapered washer 110, and a center element 54 in the form of a cylindrical washer 112 disposed between the two guide elements. In the same way described above, elements 52 and 54 are ring shaped like washers having central openings through which rod member 36 passes.

Lower grooved tightening member 108 may have one or more parallel, such as grooves 114, 116 sized and positioned to slidingly receive the two downwardly extending flanges 22D and 22E terminating in lower surfaces 22H and 22I. The tapered washer 110 may generally taper from a larger diameter portion disposed outside of slot 48 to a smaller diameter portion disposed in slot 48 adjacent to cylindrical washer 112 disposed entirely in slot 48 between upper tightening member 44 and lower tightening member 108. The larger diameter portions of washer 110 are wider than slot 48 and the smaller diameter portions are narrower than slot 48 so that the tapered region of tapered washer 110 contacts upper surfaces 22F and 22G of the flanges.

The guide assembly 30 may function similar to the guide assembly described above, to center the mounting assembly 60 in slot 48. However in this example the guide assembly may reduce friction during the rotation of the tapered washer 110 and cylindrical washer 112 around axis 56 as the mounting assembly is slid along the two inwardly bent flanges 22D and 22E. During movement of the mounting assembly, the lower edges of flanges 22D and 22E slide along respective grooves 114, 116. Once the mounting assemblies 102 are in the desired positions on the support structures 22, the biasing element 32 biases the tapered washer 110 against the upper surfaces 22F and 22G, and biases the lower grooved tightening member 108 against the lower surfaces 22H and 22I of the support structure flanges.

The biasing element 32 may be a compression spring 106, as shown, or other suitable biasing device and may be positioned between the tapered washer 110 and anti-rotation member 107, if it is used, or the solar panel frame 62. The compression spring 106 may resiliently urge the tapered washer 110 toward the upper surfaces 22F and 22G of the support structure 22 and may resiliently urge the solar panel frame 62 and upper tightening member 44 away from the tapered washer 110. Since the upper tightening member 44 may be affixed to the rod member 36 and the lower grooved tightening member 108, the compression spring 106 may bias upwardly the rod member 36 and the lower grooved tightening member 108 as well. This retains the lower edges of flanges 22D and 22E in grooves 114 and 116. Thus, the resilience provided by the compression spring 106 allow for vertical flexibility that allows absorption of physical stresses and accommodates tolerance variations during manufacture of the parts, while providing a sufficient amount of resilience to support and retain the mounted solar panel on the support structure.

FIG. 5 shows a stop member 120 mounted to a support structure 22. In this example, the stop member 120 may include a bolt 122 that may be positioned in aligned openings 124 and 125 in respective sides 22B and 22C of the support structure 22. When in position, bolt 122 extends across channel 46. The bolt 122 may be secured by a nut 126, as shown. Stop member 120 is positioned to prevent a mounting assembly mounted on support structure 22 from moving along slot 48 past the stop member. As shown in FIG. 9, below, the stop member establishes the end position of a mounting assembly in the support structure. Any suitable structure that limits the travel of a mounting assembly in the support structure may be used.

Figure 6:
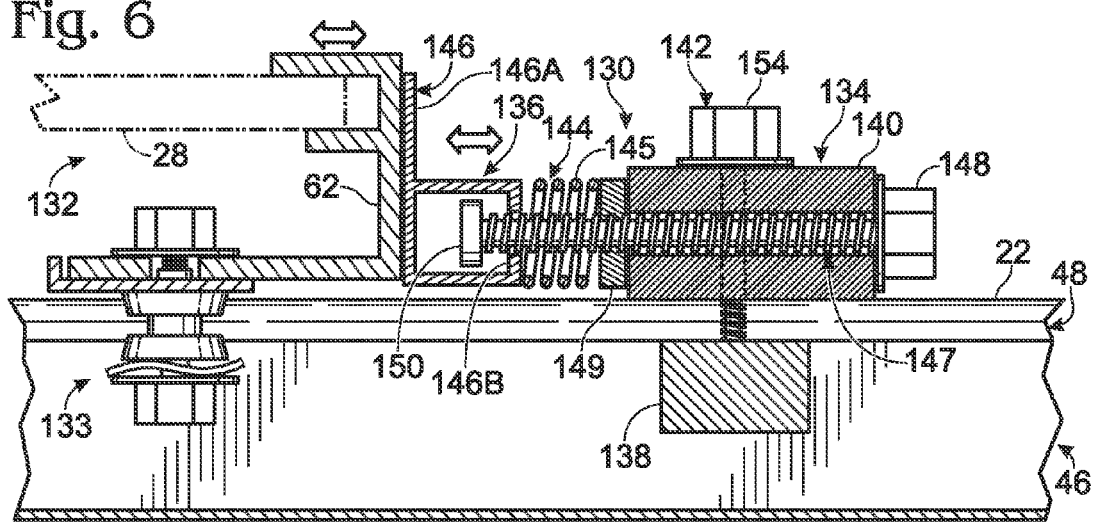
FIG. 6 is a cross-sectional view showing an example of a retention device in operative contact with an edge of a solar panel, supported by a solar-panel mounting assembly similar to the mounting assembly of FIG. 1, the retention device retaining the solar panel in a horizontal position.

In another example, a retention device 130 may be used to limit the movement of a solar panel assembly 132 along support structure 22, as shown in a side cross section in FIG. 6. As discussed previously, solar panel assembly 132 may include a solar panel 28, a solar panel frame 62, and a mounting assembly 133. The retention device 130 may include a base assembly 134, and a stop assembly 136.

The base assembly 134 may include a lower mounting element 138, an upper base element 140, and a bolt 142. The lower mounting element may have a threaded bore into which a shaft of bolt 142 is screwed. Upper base element 140 may correspondingly have a bore through which the shaft of bolt 142 freely passes. The lower mounting element 138 may be in the form of a block or other structure having a width wider than the slot 48 but narrow enough to fit within the channel 46 of the support structure 22. The upper base element is of a size suitable for being supported on the flanges of the support structure 22.

In this example, the base assembly 134 supports the stop assembly in a fixed position on support structure 22. The stop assembly 136 may include a bias member 144, such as a spring 145 or other suitable biasing device, a stop member 146, and a base arm 147, such as a shaft of a threaded bolt 148. The base arm 147 extends freely through a bore in upper base element 140 in line with the length of support structure 22 and is secured in position in upper base element 140 by a nut 149.

Stop member 146 may be any structure suitable for applying a restraining force from bias member 144 against solar panel frame 62. In this example, stop member 146 includes a first plate portion 146A that presses against the solar panel frame and a second plate portion 146B spaced from the first plate portion and having an opening through which base arm 147 freely extends. An end of base arm 147 is disposed between first and second plate portions 146A and 146B, and is retained in this region by a retention element 150, such as a nut threadedly mounted on the end of the base arm. Spring 145 is held in compression between nut 149 and second plate portion 146B. The spring 140 may resiliently urge the stop member 146 away from the base assembly 134 along the support structure 22. Since the base assembly 134 may be fastened to the support structure 22, the spring 145 may bias the stop member 146 against the solar panel assembly 132.

During use, the retention device 130 may be slid along the elongate slot 48 of the support structure 22 until the stop member 146 comes into contact with the solar panel assembly 132. Once the retention device 130 is in the desired position on the support structure 22, the base assembly 134 may be fastened to the support structure 22. With retention element 150 positioned in an intermediate position between first and second plate portions 146A and 146B of the stop member 146, the solar panel assembly can move either direction along support structure 22 and still be held in tension. Thus, the resilience provided by biasing element 144 allows lateral flexibility along the elongate slot 48 of the support structure 22 that accommodates thermal expansion and contraction of solar panels in the solar panel assembly or an array of solar panel assemblies, as well as absorption of physical stresses produced by ambient conditions, while providing a sufficient amount of force to maintain the general relative positions of solar panels in the solar panel assembly 132 that are mounted on a common support structure 22 and keep them in contact with each other.

Figure 4:
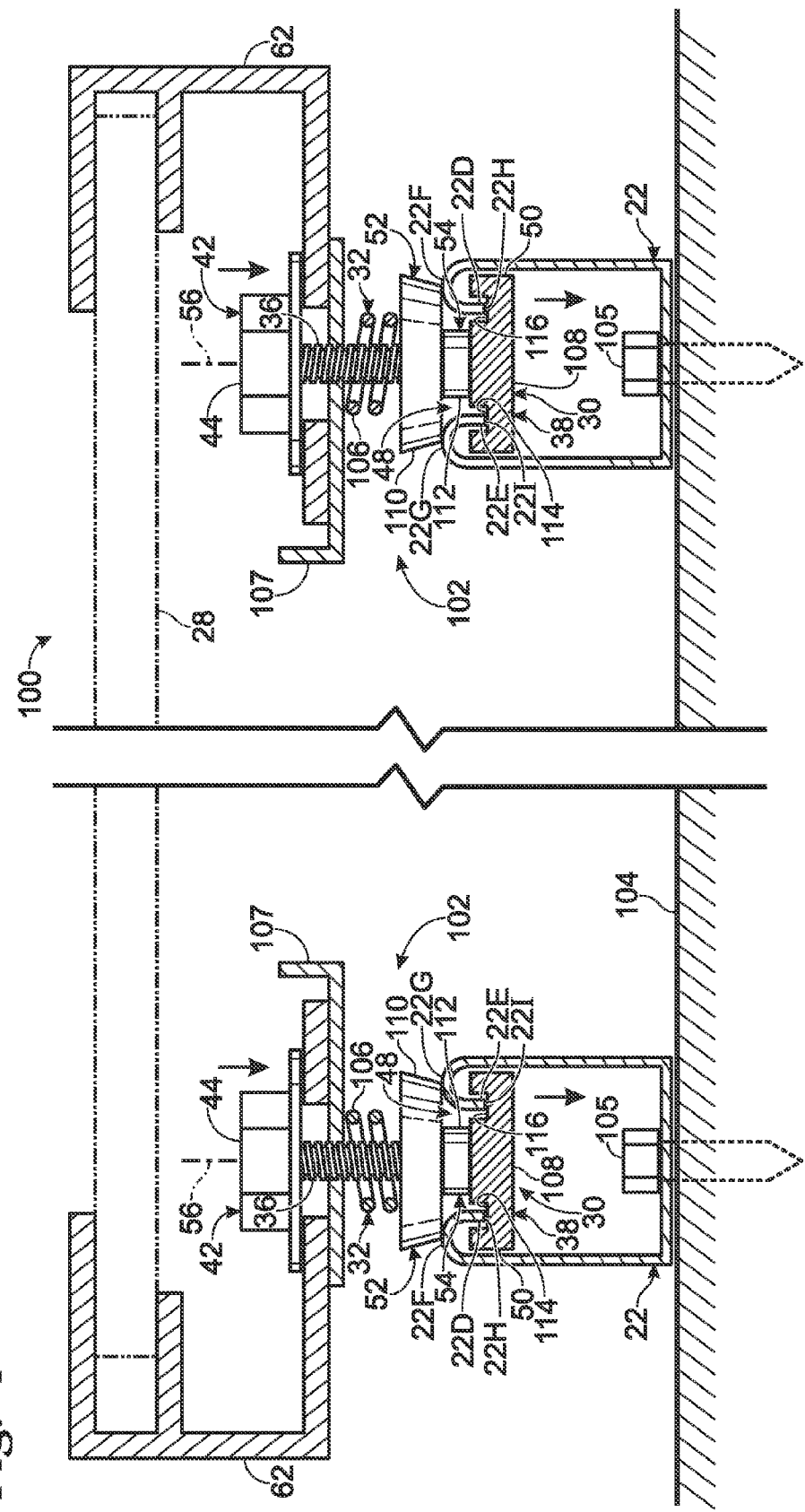
FIG. 4 is a partial cross-sectional view showing yet a further example of solar-panel mounting assemblies supporting a solar panel.
Figure 7:
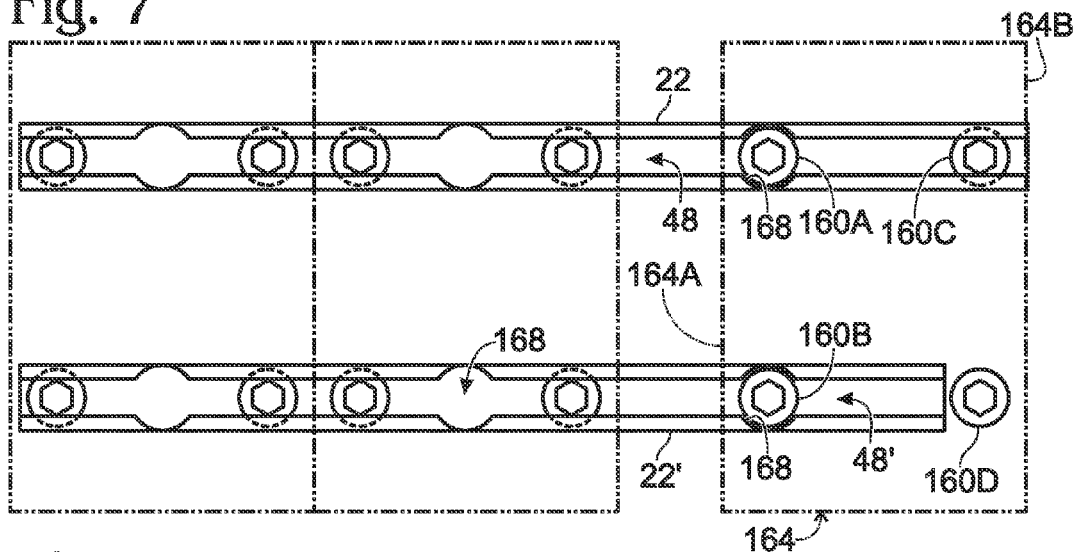
FIG. 7 is a simplified top view showing an example of an array of solar panels during installation on a support structure.
Figure 8:
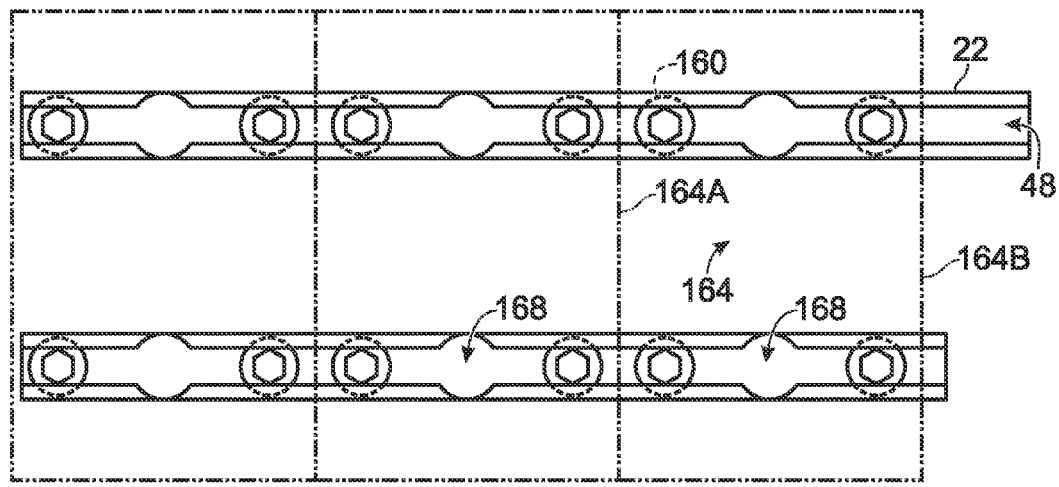
FIG. 8 is a view similar to FIG. 7 showing the array of solar panels in a seated position on the support structure.

A first method of mounting a solar panel assembly 164 to a support structure 22 is shown generally in FIGS. 7-9. The method of mounting a solar panel assembly 164 to a support structure 22 may include mounting one or more mounting assemblies 160, such as mounting assemblies 20, 60, or 102 described previously, to a solar panel assembly 164. In this example, mounting assemblies 160A, 160B, 160C, and 160D are attached to each solar panel assembly 164 at suitably spaced locations, as shown. It will be noted that two support structures 22 and 22' having respective lengthwise slots 48 and 48' are used in this example to mount the solar panels. Support structure 22 extends further to the right than support structure 22'. The solar panel is mounted by first inserting mounting assembly 160A on support structure 22, as shown in FIG. 4. Mounting assembly 160A is then moved to the left by moving solar panel assembly 164 to the left until mounting assembly 160B is aligned with slot 48' of support structure 22'. Both mounting assemblies 160A and 160B are then slid to the left in the respective slots by moving solar panel assembly 164 to the left until mounting assembly 160C is aligned with slot 48. Mounting assembly 160C is then inserted onto support structure 22 and the solar panel shifted further to the left until mounting assembly 16D is aligned with slot 48'. The fourth and final mounting assembly for solar panel assembly 164 is then inserted onto support structure 22'. Solar panel assembly 164 may then be moved into a desired position along support structures 22 and 22' by sliding the mounting assemblies along the support structure slots, such as to the position shown in FIG. 8.

An assembled array 166 of solar panel assemblies 164 is illustrated in FIG. 9. In this example, array 166 includes 7 solar panel assemblies. Each solar panel assembly is mounted to support structures 22 and 22' by four mounting assemblies 160. The array is maintained in position on the support structures by stop members 120 on the left ends of the support structures and by retention devices 130 on the right ends of the support structures as shown. The array may be disassembled by reversing these steps.

A second method of mounting solar panel assembly 164 takes advantage of support structures that have enlarged openings 168 in slot 48 at spaced positions along the support structures. In this example, there is an opening 168 at each solar panel assembly position. Rather than inserting the solar panel assemblies from one end of the support structures, as described above, the solar panel assemblies may be installed on the support structures close to the final position of each solar panel assembly. Mounting assemblies 160 and openings 168 are sized so that the portion of the mounting assemblies disposed in channel 46 are able to pass freely down through openings 168 normal to slot 48. For illustration purposes, the mounting assemblies 160 in FIGS. 7-8 may only show a washer or part of the mounting assembly 160 that is positioned in channel 46 to illustrate the use of the openings.

This is illustrated in FIG. 7 in which the right-most solar panel assembly 164 is positioned with mounting assemblies 160A and 160B aligned with corresponding openings 168 in respective support structures 22 and 22'. In this example, mounting assembly 160C may be installed in support structure 22 prior to inserting support structures 160A and 160B into the openings. Optionally, mounting assembly 160C may be installed on support structure 22 subsequent to inserting support structures 160A and 160B into the openings by moving the solar panel assembly to the right far enough to mount mounting assembly 160C on support structure 22, followed by mounting assembly 160D.

The mounting of one or more mounting assemblies 160 to a solar panel assembly 164 may also be performed and prepared off-site, allowing for a rapid on-site installation process. Once the desired number of solar panel assemblies 164 are mounted, one may fix them in position by mounting one or more resilient devices 130 and/or stop members 120 to the one or more ends of the solar panel assemblies 164 on the support structure 22 as shown in FIG. 9, providing an on-site installation requiring few tools and a low level of skill.

In another example, a method of removing a solar panel assembly from a support structure 22 is shown generally in FIGS. 10-14. FIG. 10 shows an array 180 of solar panel assemblies, including solar panel assemblies 184 and 186 mounted to support structures 22 and affixed by mounting assemblies such as mounting assemblies 188 and 190 for solar panel assembly 184. Array 180 is held in position by stop members 120 and retention devices 130 mounted to support structures 22.

The method of removing solar panel assembly 184 from support structure 22 may include removing a retention devices 130 or stop member 120, and sliding any necessary solar panel assemblies, such as solar panel assembly 186, sufficiently far away from solar panel assembly 184 to allow solar panel assembly 184 to be moved to a position where mounting assembly 188 is aligned with an opening 192, as shown in FIG. 11. A first end 182A of the solar panel assembly 182 is then lifted out of an opening 192 in slot 48 of support structure 22, as shown in FIG. 12. Solar panel assembly 182 is then slid along support structure 22 until mounting assembly 190 is aligned with a second opening 194 in slot 48, as shown in FIG. 13. The second end 182B of the solar panel assembly 184 is then lifted out of the second opening 194, as shown in FIG. 14, freeing solar panel assembly 182 from the support structure. This process may then be reversed to replace or install solar panel assembly 182 on support structure 22, making maintenance of the array 180 of solar panel assemblies a relatively simple process.

This description is illustrative and directed to the apparatus and/or method(s) described, and is not limited to any specific invention or inventions. The claims that are appended to this description, whether now or later in this or a subsequent application, define specific inventions included in the described apparatus and or methods. No single feature or element, or combination thereof, is essential to all possible combinations that may now or later claimed. While examples of apparatus and methods are particularly shown and described, many variations may be made therein. Such variations, whether they are directed to different combinations or directed to the same combinations, whether different, broader, narrower or equal in scope, are also regarded as included within the subject matter of the present disclosure. An appreciation of the availability, scope or significance of various inventions may not be presently realized. Thus, any given invention disclosed by example in the disclosure does not necessarily encompass all or any particular features, characteristics or combinations, except as specifically claimed.

Where "a" or "a first" element or the equivalent thereof is recited, such usage includes one or more such elements, neither requiring nor excluding two or more such elements. Further, ordinal indicators, such as first, second or third, for identified elements are used to distinguish between the elements in the order in which they are introduced, and do not indicate a required or limited number of such elements, and do not indicate a particular position or order of such elements unless otherwise specifically indicated. Accordingly, the ordinal indicator used for a particular element may vary in different contexts.

The invention claimed is:

1. A mounting assembly for supporting a solar panel relative to a support structure, when the solar panel is supported above the support structure, the support structure having an upper surface and a lower surface spaced from the upper surface, the mounting assembly comprising:
 a restraining element;
 a retaining element; and a biasing assembly disposed between the restraining element and the retaining element and including at least a first biasing element, wherein, when the mounting assembly is mounted on the support structure with the restraining element below and facing the lower surface of the support structure and the retaining element above and facing the upper surface of the support structure, and a securing element attached to a solar panel is secured between the retaining element and the upper surface of the support structure by a force applied through the first biasing element, the first biasing element resiliently urges the retaining element away from the upper surface of the support structure or resiliently urges the restraining element away from the lower surface of the support structure, wherein the first biasing element resiliently urges the restraining element away from the lower surface of the support structure, and the biasing assembly further includes a second biasing element, wherein, when the mounting assembly is mounted on the support structure with the restraining element below and facing the lower surface of the support structure and a securing element supporting a solar panel is secured between the retaining element and the upper surface of the support structure, the second biasing element resiliently urges the securing element toward the retaining element.

2. A solar panel assembly comprising:

a solar panel having an attached securing element;

a support structure for supporting the solar panel during use, the support structure including a support rail having an elongate slot and two inwardly bent flanges extending into the elongate slot; and at least one mounting assembly for mounting the securing element adjacent to an upper surface of the flanges of the support structure during use, the mounting assembly comprising:

a rod member extending along a central axis, the rod member having a first end retained during use within the support rail, the securing element supported by the rod member distally of the first end, a restraining element mounted on the first end of the rod member below and facing a lower surface of the flanges, a first biasing element disposed on the rod member between the restraining element and the flanges, the first biasing element resiliently compressible along the central axis, resiliently urges the restraining element away from the lower surface of the flanges, and resiliently urges the securing element toward the upper surface of the flanges, and a sliding assembly disposed on the rod member for slidable movement of the rod member along the elongate slot, the sliding assembly including at least a first washer in operative contact with one of the upper and lower surfaces of the flanges, the first biasing element also resiliently urging the first washer toward the one surface of the flanges.

3. The solar panel assembly of claim 2, wherein the first washer is in operative contact with an outwardly facing surface of the two flanges and the sliding assembly further includes a second washer in operative contact with an inwardly facing surface of the two flanges.

* * * * *